(12) United States Patent  (10) Patent No.: US 6,620,298 B1
Hayata                          (45) Date of Patent:    Sep. 16, 2003

(54) MAGNETRON SPUTTERING METHOD AND APPARATUS

(75) Inventor: Hiroshi Hayata, Hirakata (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/550,999

(22) Filed: Apr. 18, 2000

(30) Foreign Application Priority Data

Apr. 23, 1999 (JP) .......................................... 11-115590
Apr. 27, 1999 (JP) .......................................... 11-118862
Jun. 25, 1999 (JP) .......................................... 11-179989

(51) Int. Cl.$^7$ ............................................. C23C 14/34
(52) U.S. Cl. ........................... 204/192.12; 204/192.13; 204/298.03; 204/298.11; 204/298.12; 204/298.14; 204/298.16; 204/298.17; 204/298.18; 204/298.19; 204/298.2; 204/298.25
(58) Field of Search ....................... 204/192.12, 192.13, 204/298.03, 298.11, 298.12, 298.14, 298.16, 298.17, 298.18, 298.19, 298.2, 298.25

(56) References Cited

U.S. PATENT DOCUMENTS

| 4,622,121 A | * | 11/1986 | Wegmann et al. ..... 204/298.18 |
| 4,853,102 A | * | 8/1989 | Tateishi et al. ........ 204/298.16 |
| 4,927,513 A | * | 5/1990 | Schultheiss ............ 204/192.13 |
| 5,718,815 A | * | 2/1998 | Szczyrbowski et al. ..................... 204/298.06 |
| 5,830,330 A | * | 11/1998 | Lantsman .............. 204/192.12 |
| 5,897,752 A | * | 4/1999 | Hong et al. ............ 204/192.12 |

* cited by examiner

*Primary Examiner*—Rodney G. McDonald
(74) *Attorney, Agent, or Firm*—Jordan and Hamburg LLP (57) ABSTRACT

A first target is arranged opposite a substrate while a second target is arranged not opposite the substrate within a vacuum chamber. Pressure within the vacuum chamber is adjusted to a first pressure, and during a period wherein the pressure is changed from the first pressure to a second pressure which is lower than the first pressure, plasma density above the second target is made greater than plasma density above the first target. At a time point when the second pressure is reached, the plasma density above the first target is made greater than the plasma density above the second target.

13 Claims, 9 Drawing Sheets

MAGNETRON SPUTTERING METHOD AND APPARATUS

BACKGROUND OF THE INVENTION

The present invention relates to a magnetron sputtering method and apparatus for film formation on a substrate used in the manufacture of semiconductors, optical disks, and electronic components.

Figure 8:
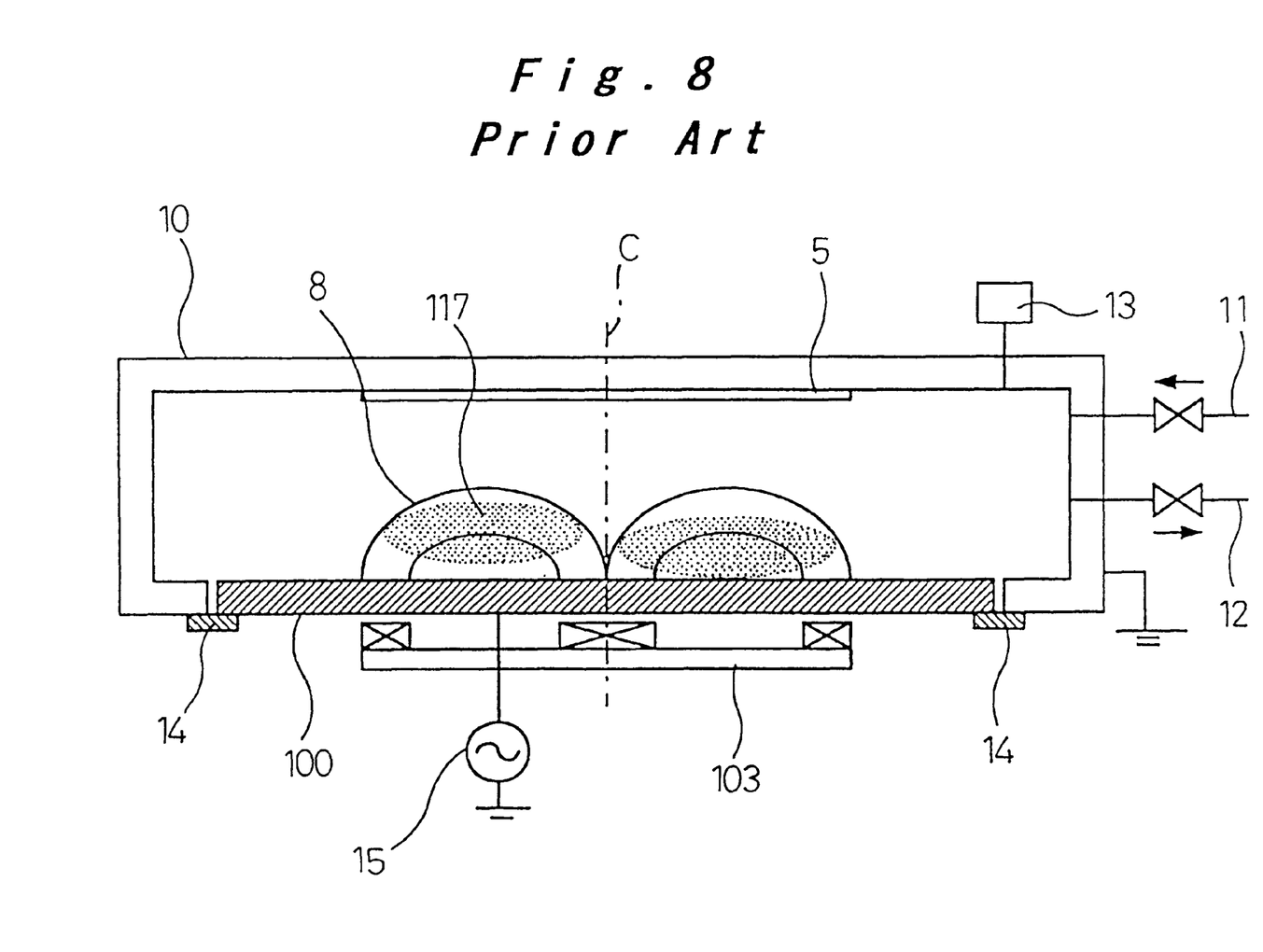
FIG. 8 is a schematic diagram showing a construction of a conventional magnetron sputtering apparatus.

FIG. 8 shows a construction of a conventional magnetron sputtering apparatus which is symmetrical about a center axis C. A substrate 5 and a target 100 are arranged opposite each other within a vacuum chamber 10. Gas is introduced from a supply line 11 into the vacuum chamber 10, and discharged from an evacuation line 12. A vacuum gage 13 is provided for monitoring the pressure within the vacuum chamber 10. The target 100 is mounted to the vacuum chamber 10 via an insulator 14. A DC or AC power source 15 is connected to the target 100. Further, a device for monitoring voltage of the target 100 is provided, although not shown. A magnetic circuit 103 is disposed on the backside of the target 100. The apparatus is operated as described below.

An inert gas such as Ar is introduced from the supply line 11 while it is discharged from the evacuation line 12. High voltage is applied to the target 100 by the power source 15 for bringing about electric discharge, whereby Ar is ionized into plasma 117. Ions collide against the negatively biased target 100 and sputter the target 100 to generate sputtered particles. The sputtered particles are deposited on the substrate 5, thereby forming a thin film.

In the magnetron sputtering apparatus, lines of magnetic force 8 are created in a tunnel-like form above the target 100, so that plasma 117 is enclosed within a magnetic field, thereby increasing plasma density and the speed of film deposition. Another advantage of magnetron sputtering is that discharge can be maintained at a low pressure.

In order to satisfy stringent requirements for a substrate for use in the fabrication of semiconductors or the like, it is essential to form a film of extremely high quality. In this regard, the following problems exist in the prior art magnetron sputtering apparatus.

While film formation at a low pressure is desirable for achieving high quality of films formed, a collision rate of electrons and the sputter gas is low at a low pressure making it difficult to produce electric discharge. Accordingly, film formation at a low pressure is usually performed by starting electric discharge as follows.

Figure 9:
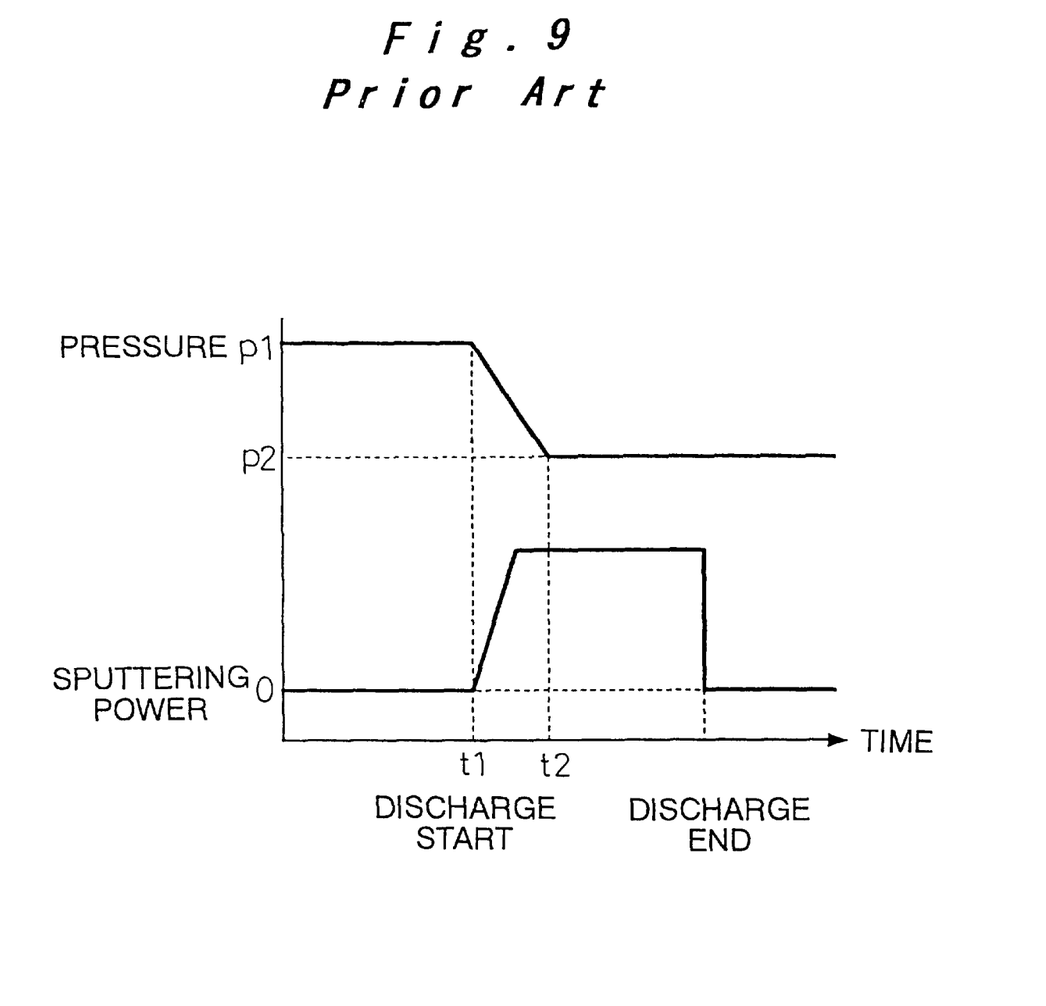
FIG. 9 is a time chart in accordance with a conventional magnetron sputtering method.

The pressure within the vacuum chamber 10 is first adjusted to a predetermined pressure P1, at which electric discharge can be started, by controlling the flow rate of Ar or discharge rate thereof from the evacuation line. The predetermined pressure P1 is higher than a target pressure P2. A power source is turned on to apply a high voltage initiating electric discharge. Once electric discharge occurs, large quantities of electrons are generated within the vacuum chamber 10, and because the magnetic field confines the electrons, the electric discharge is maintained even at a low pressure. Therefore, when the start of electric discharge is recognized through monitoring changes in the voltage of the target 100, the pressure within the vacuum chamber 10 is lowered to pressure P2 for achieving film formation to a desired thickness. FIG. 9 is a timing chart showing changes in the pressure and sputtering power in the above described operation.

In the above-described conventional magnetron sputtering method, there is a problem in that the quality of the film which is formed during the time period from t1 to t2 is deteriorated because the target pressure P2 is not reached during this period.

Another problem in the prior art apparatus is that the sputtered particles are deposited on the chamber wall around the substrate. The sputtered particles form a film on the wall, and as the thickness of the film increases, the film eventually falls off and becomes dust. Dust deposited on the substrate deteriorates the quality of the film formed and causes defects in the product. Therefore, it is the normal practice to provide a shield in an area surrounding the substrate and to replace the shield before the sputtered particles deposited thereon start peeling off.

In order to meet demands for higher productivity, however, the electric discharge power needs to be increased, and often the substrate and the target are placed closer to each other. In such cases, the shield is subjected to greater energy of electron collision, and films on the shield are more apt to peel because of thermal shock.

SUMMARY OF THE INVENTION

In view of the foregoing, an object of the present invention is to provide a method and apparatus for magnetron sputtering with which high film quality can be achieved.

To accomplish the above object, the present invention provides a magnetron sputtering method, wherein a first target is arranged opposite a substrate while a second target is arranged not opposite the substrate but within the vacuum chamber. Pressure within the vacuum chamber is adjusted to a first pressure, and during a period from the first pressure to a second pressure, which is lower than the first pressure, plasma density above the second target is made greater than plasma density above the first target, and at a time point when the second pressure is reached, the plasma density above the first target is made greater than the plasma density above the second target. According to this method, electric discharge is first brought about above the second target which is not opposite the substrate. Since the second target is not opposite the substrate, sputtered particles are rarely deposited on the substrate during a period from the start of electric discharge until a target pressure, that is, the second pressure, is reached. Also, the electric discharge above the second target supplies electrons which facilitate starting electric discharge above the first target opposite the substrate at a low pressure. Thus, the quality of a film formed at a low pressure can be improved by suppressing film formation at pressures other than the target pressure.

The present invention further provides a magnetron sputtering method comprising the steps of arranging a first target within a vacuum chamber, arranging a substrate opposite the first target within the vacuum chamber, arranging a second target within the vacuum chamber with a face surface not facing the substrate, introducing a gas into the vacuum chamber and adjusting pressure within the vacuum chamber to a first predetermined pressure, providing a first magnet and a second magnet respectively to the first target and the second target for creating magnetic fields above the first target and the second target, movably supporting the first magnet so as to be movable to and from the first target to permit application and removal of the magnetic field above the first target, reducing the pressure in the vacuum chamber from the first predetermined pressure to a second predetermined pressure which is less than the first predetermined pressure, positioning the first magnet away from the first target so that a magnetic field is formed only above the second target by use of the second magnet while the vacuum chamber is at the first predetermined pressure and while the pressure in the vacuum chamber is being reduced to the second predetermined pressure, applying a voltage to the second target to generate plasma at the second target when the pressure is at the first predetermined pressure, and positioning the first magnet near the first target, when the second predetermined pressure is reached, so that a magnetic field is formed above the first target by at least the first magnet and applying a voltage across the first target and the substrate so that film-formation on the substrate is effectuated.

Other and further objects, features and advantages of the invention will appear more fully from the following description.

DETAILED DESCRIPTION OF PREFERRED EMBODIMENTS

Figure 1:
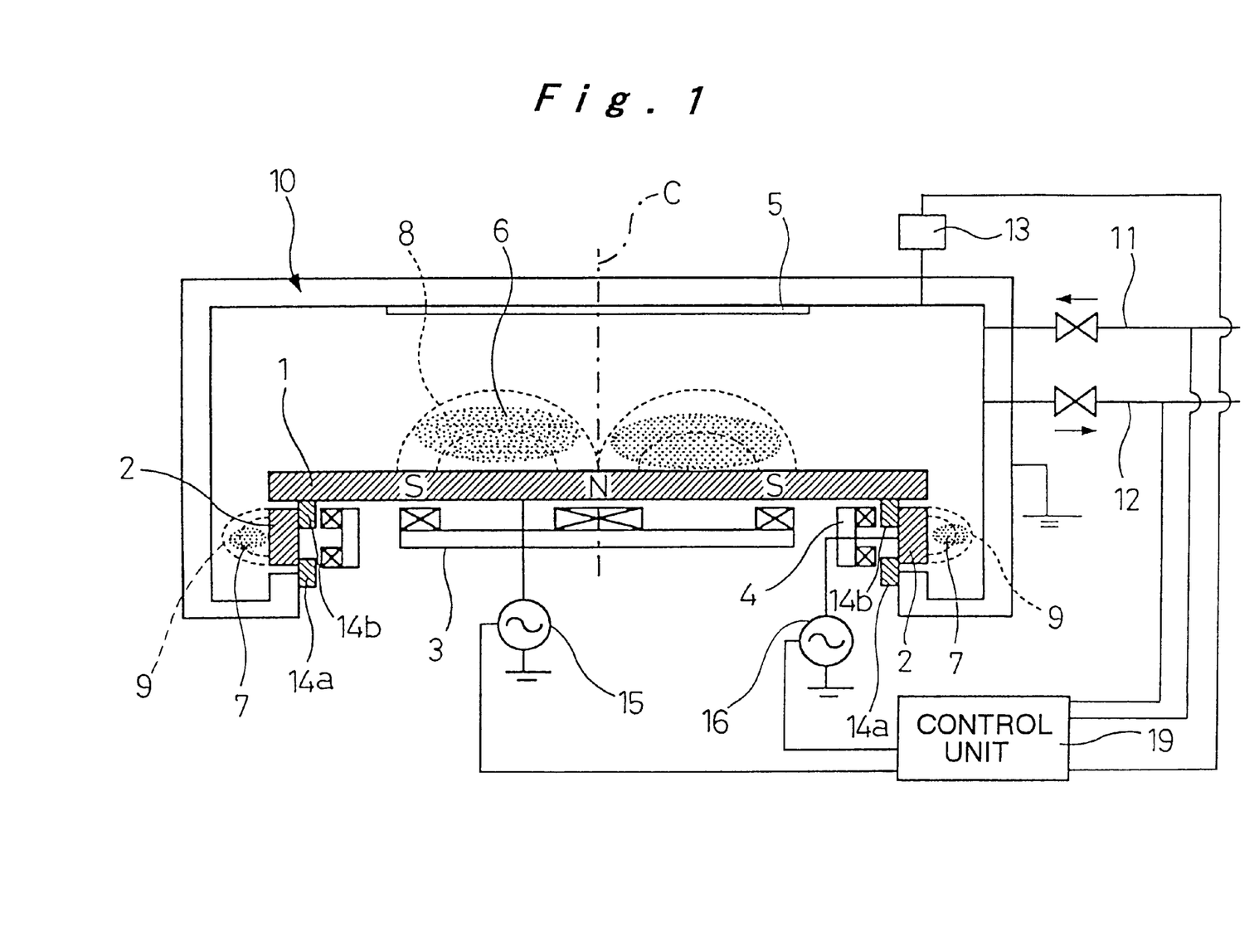
FIG. 1 is a schematic diagram showing a construction of a magnetron sputtering apparatus according to a first embodiment of the present invention.

Preferred embodiments of a magnetron sputtering method and apparatus according to the present invention are hereinafter described with reference to FIGS. 1 through 7. FIG. 1 shows a construction of a magnetron sputtering apparatus according to a first embodiment of the present invention. The apparatus is symmetrical about a center axis C. Same elements as those in the apparatus shown in FIG. 8 are given the same reference numerals. A substrate 5, target 1, and annular target 2 are arranged in a vacuum chamber 10. The target 1 is disposed opposite the substrate 5. The annular target 2 is not disposed opposite the substrate 5 but is disposed on a backside at a periphery of the target 1 and is electrically insulated therefrom. Gas is introduced from a supply line 11 into the vacuum chamber 10, and discharged by an evacuation line 12. A vacuum gage 13 is provided for monitoring pressure within the vacuum chamber 10. The annular target 2 is mounted to the vacuum chamber 10 via an insulator 14a, and target 1 is mounted to the target 2 via an insulator 14b. Separate power sources 15, 16 are respectively provided for the target and annular target 1 and 2 for applying voltage thereto. A magnet circuit 3 is arranged on a backside of the target 1 for creating a tunnel-like magnetic field 8, and a magnet circuit 4 is arranged on an inner side of the annular target 2 for creating a tunnel-like magnetic field 9 thereabove, as shown in FIG. 1. Film-formation on the substrate 5 is achieved through the following procedures with control being effected by a control unit 19.

An inert gas, such as Ar, is introduced through the gas supply line 11 while discharging gas via the evacuation line 12. When the pressure inside of the vacuum chamber 10 has reached a first pressure P1 which is higher than a target pressure P2, voltage is applied to the annular target 2 from the power source 16. Upon confirming the inception of first discharge 7 above the annular target 2, the pressure is lowered to the target pressure P2, at which power supply is started from the power source 15 to the target 1, whereby film-formation is started.

According to this method, while the first discharge 7 continuously provides electrons, a second discharge 6 above the target 1 is started only at a desired, low pressure. Sputter particles caused by the first discharge 7 are rarely deposited on the substrate 5 since the annular target 2 is not arranged opposite the substrate 5. Thus only sputter particles caused by the second discharge 6 above the target 1 are deposited on the substrate 5 and this deposition is effected only at the target low pressure P2, whereby the quality of the film formed is improved.

The magnet circuit 4 disposed on the backside of the annular target 2 for creating the tunnel-like magnetic field 9 on the annular target 2 helps contain the first discharge 7 within the endless magnetic tunnel 9, and thereby the first discharge 7 is made stable at a low pressure. However, the magnet circuit 4 is not essential for the entire apparatus and can be dispensed with.

Figure 2:
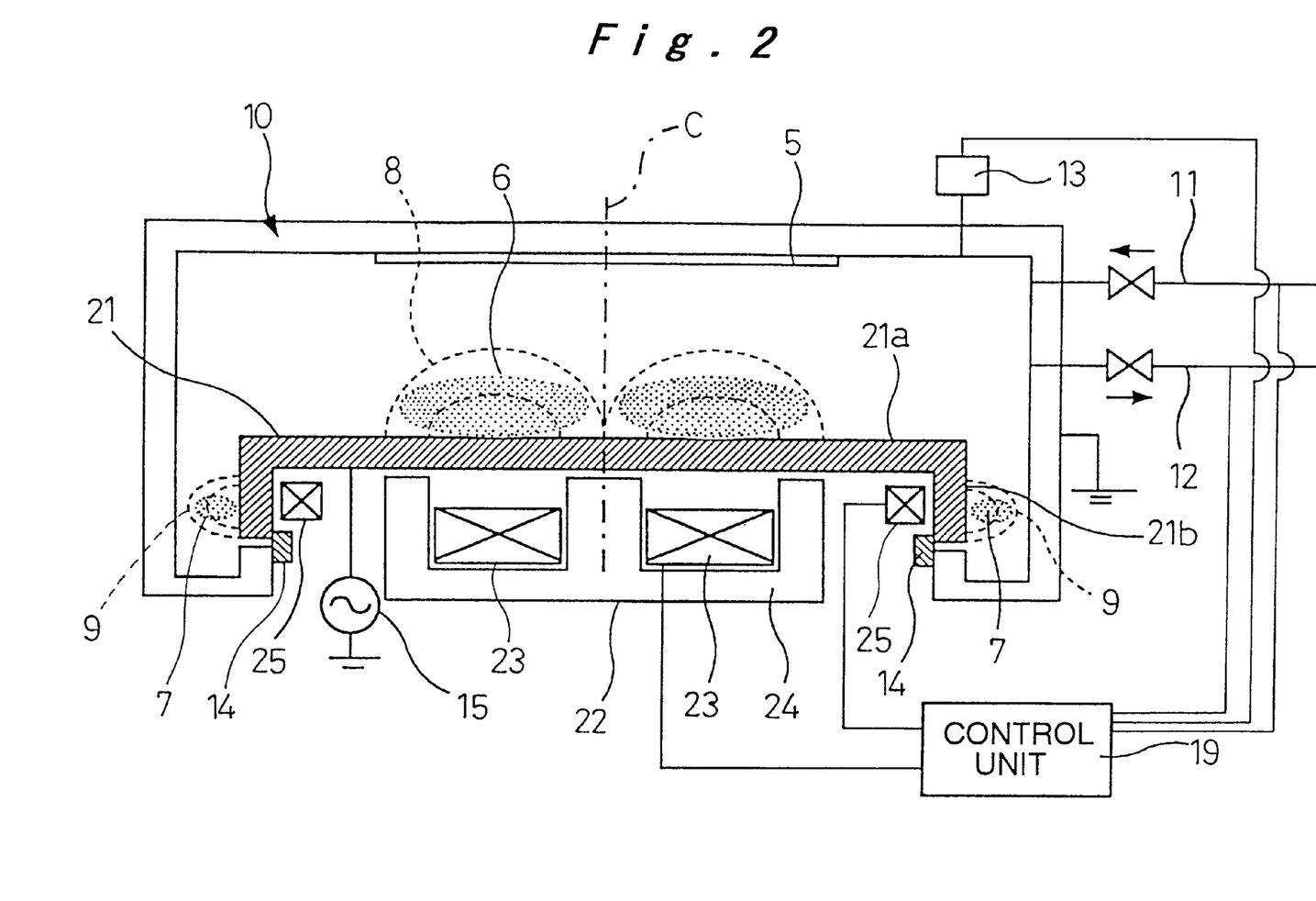
FIG. 2 is a schematic diagram showing a construction of a magnetron sputtering apparatus according to a second embodiment of the present invention.

FIG. 2 shows a second embodiment of the present invention. The second embodiment is different from the above described first embodiment in that it is constructed with a single power source and a single target. The elements identical to those in the previously described embodiment are given the same reference numerals, and the descriptions thereof are omitted. Target 21 is in a disk-like shape and has a front surface 21a right opposite the substrate 5 and an annular surface 21b formed at a periphery thereof on a backside of the front surface 21a. An electromagnet 22 comprising a coil 23 and a yolk 24 is arranged on the backside of the front surface 21a for forming a tunnel-like magnetic field 8 on the front surface 21a. Electric current is supplied to the coil 23 from a power source (not shown). The annular surface 21b is also provided on its inner side with an electromagnet 25, to which electric current is supplied from a power source (not shown), so that a tunnel-like magnetic field 9 is formed on the annular surface 21b.

Film-formation on the substrate 5 is achieved through the following procedures with the control being effected by the control unit 19. An inert gas, such as Ar, is introduced through the gas supply line 11 and gas and gas is discharged via the evacuation line 12, until the pressure inside of the vacuum chamber 10 reaches the predetermined first pressure P1 at which discharge can be started. When the first pressure P1 is reached, voltage is applied to the target 21 from the power source 15. At this time, electric current is supplied only to the electromagnet 25 and no current is supplied to the electromagnet 22, so that the first discharge 7 only occurs above the annular surface 21b.

Upon confirming the inception of the first discharge 7 above the annular surface 21b, the pressure inside of the vacuum chamber 10 is lowered to the intended target pressure P2, at which point electric current is supplied to the electromagnet 22. Intensive second discharge 6 starts thereupon above the front surface 21a opposite the substrate 5, and a film is formed on the substrate 5. As described above, when the pressure is higher than the desired low target pressure P2, discharge occurs only on the annular surface 21b which is not opposite the substrate 5. Therefore sputter particles are not deposited on the substrate 5 until the pressure reaches the predetermined low target pressure P2. Furthermore, the first discharge 7 on the annular surface 21b provides electrons, whereby the second discharge 6 on the front surface 21a can be started even at the low target pressure P2. Thus film-formation can be started only at the low target pressure P2, and high quality of the film formed can be achieved.

Figure 3A:
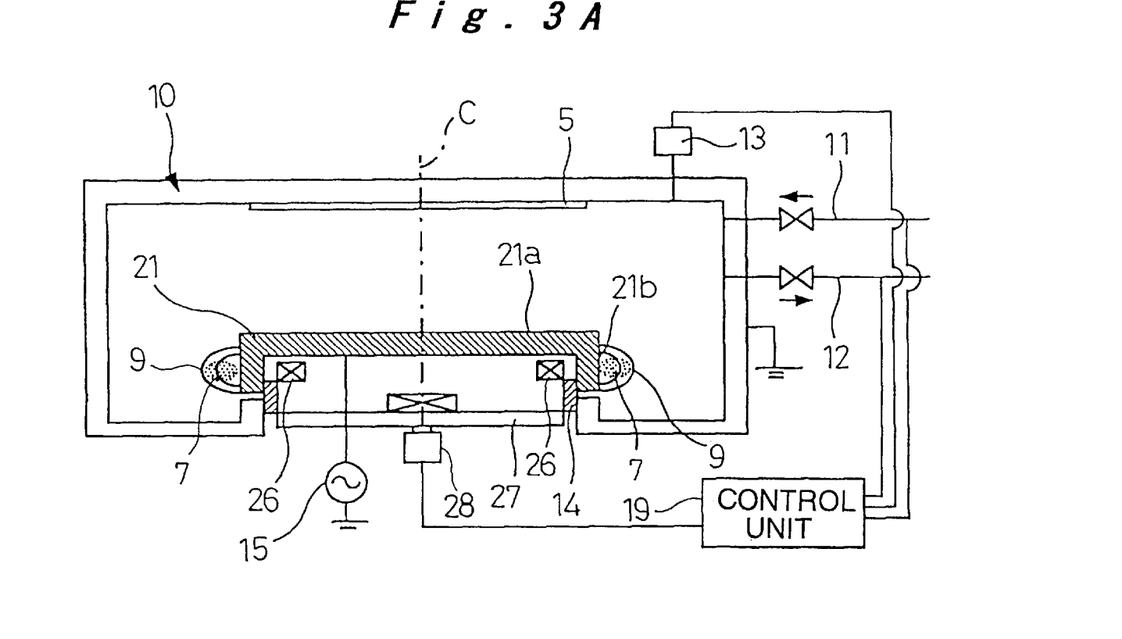
FIGS. 3A and 3B are schematic diagrams showing states of the magnetron sputtering apparatus according to a third embodiment of the present invention at a discharge inception pressure and at a target pressure.
Figure 3B:
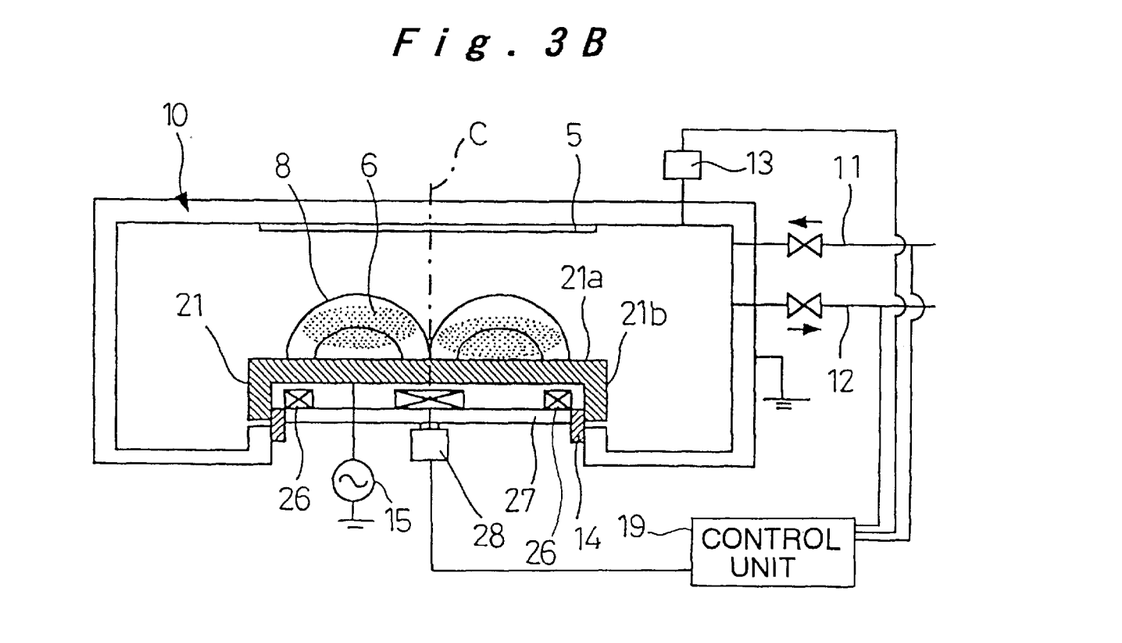

FIGS. 3A and 3B show a third embodiment of the present invention. While current supply to the electromagnets is manipulated for controlling generation of magnetic fields upon the target in the second embodiment described above, the third embodiment adopts a configuration in which a permanent magnet, which functions as a magnet circuit for effecting generation of a magnetic field upon a portion on the target opposite the substrate 5, is moved with respect to the target. The elements identical to those in the previously described embodiments are given the same reference numerals, and the descriptions thereof are omitted.

The target 21 includes the front surface 21a opposite the substrate 5 and the annular surface 21b which is not opposite the substrate 5 as in the previous embodiment. A permanent magnet 26 is fixed on the backside of the annular surface 21b for creating the tunnel-like magnetic field 9 on the annular surface 21b. Furthermore, a permanent magnet 27 is provided such that it can be moved towards and away from the front surface 21a of the target 21, so that, when the permanent magnet 27 is positioned near the front surface 21a, it creates the tunnel-like magnet field 8 on the front surface 21a of the target 21 together with the permanent magnet 26. A lifting mechanism 28 is provided for displacing the permanent magnet 27 towards and away from the target 21.

Film-formation on the substrate 5 is achieved through the following procedures with the control being effected by the control unit 19. An inert gas, such as Ar, is introduced through the gas supply line 11 while discharging the gas is done via the evacuation line 12, until the pressure inside of the vacuum chamber 10 reaches the predetermined first pressure P1 at which discharge can be started. When the first pressure P1 is reached, voltage is applied to the target 21 from the power source 15, in a state that the permanent magnet 27 is positioned apart from the target 21 as shown in FIG. 3A, so that the first discharge 7 only occurs around the annular surface 21b.

Upon confirming the inception of the first discharge 7 above the annular surface 21b, the pressure inside of the vacuum chamber 10 is lowered to the target pressure P2, at which point the permanent magnet 27, which functions as a magnet circuit, is brought near the target 21 as shown in FIG. 3B. Intensive second discharge 6 starts thereupon above the front surface 21a opposite the substrate 5, and a film is formed on the substrate 5. As described above, when the pressure is higher than the desired low target pressure P2, discharge occurs only on the annular surface 21b which is not opposite the substrate 5. Therefore sputter particles are not deposited on the substrate 5 until the pressure reaches the predetermined low target pressure P2. Furthermore, the first discharge 7 on the annular surface 21b provides electrons, whereby the second discharge 6 on the front surface 21a can be brought about even at the low target pressure P2. Thus film-formation can be started only at the low pressure, and the quality of the film formed is improved.

The above described first embodiment has the advantage over the second and third embodiments in that the discharge on the surface of the target right opposite the substrate can be reliably suppressed. On the other hand, the second and third embodiments have the advantages in that only one sputter power source is required and the design for the matching network is simplified. Furthermore, the second embodiment is advantageous in that switchover of the discharge occurring at different portions of the target can be effected swiftly, and the third embodiment is advantageous in that no power sources for electromagnets are necessary.

Next, modifications of the present invention magnetron sputtering apparatus are described, in which deposition of dust generated from the films formed on the chamber wall is prevented for achieving high quality of the film formed.

Figure 4:
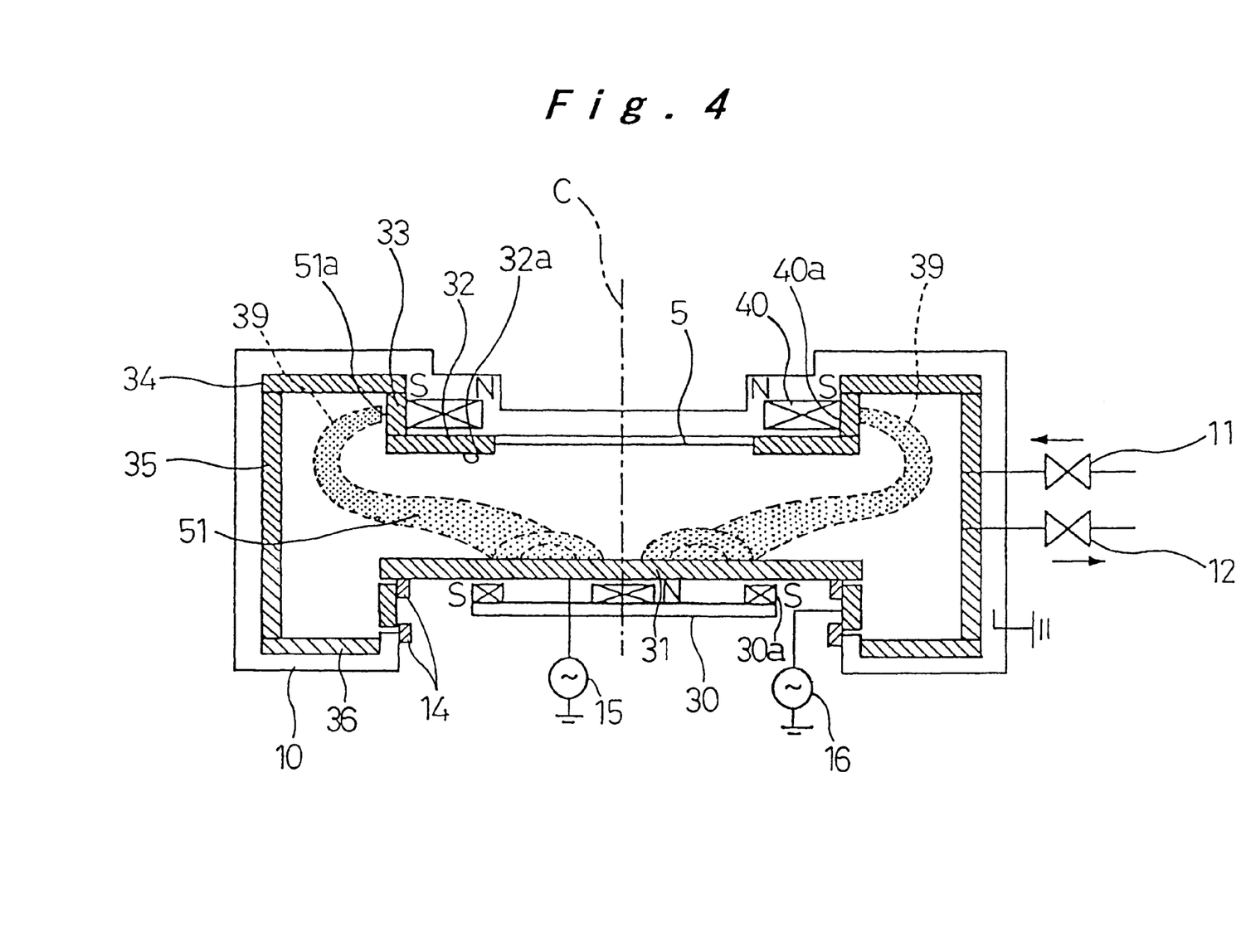
FIG. 4 is a schematic diagram showing a construction of a magnetron sputtering apparatus according to a fourth embodiment of the present invention.

FIG. 4 shows a magnetron sputtering apparatus according to a fourth embodiment of the present invention. The elements identical to those in the previously described embodiments are given the same reference numerals, and the descriptions thereof are omitted. Although not shown, the apparatus is connected to a control unit for effecting control of overall operation of the apparatus.

Target 31 is mounted to the vacuum chamber 10 via the insulator 14 opposite the substrate 5, and a second target is arranged not opposite the substrate 5. The inner wall of the vacuum chamber 10 is covered with replaceable shields 32–36 except for a portion where the substrate 5 exists. Although not shown, heaters or thermocouples are respectively connected to each of the shields 32–36 for heat control thereof. The first shield 32 functions as a first shielding portion opposite the target 31 and the second shield 33 functions as a second shielding portion, not opposite the target 31, but at a periphery of the first shielding portion.

A magnet 40 is provided on a backside of the second shield 33 as a magnet field control means for creating a line of magnetic force 39 from the target 31 towards the second shielding portion as shown in FIG. 4. The polarity of a pole 40a near the second shield 33 is made the same as that of an outside pole 30a of the magnetic circuit 30 on the backside of the target 31. The apparatus is operated as previously described.

Since the polarity of the magnet 40 at the pole 40a near the second shield 33 is made identical to that of the outside pole 30a of the magnetic circuit 30, a line of magnetic force 39 is formed from the target 31 towards the second shield 33 on the side of the substrate of the lines of magnetic force 38 which form a tunnel-like magnetic field above the target 31. Electrons of plasma 51 are thus led towards the second shield 33 by this line of magnetic force 39. That is, surface 51a, which is subjected to heat shock by the plasma 51, is set on the surface of the second shield 33 and not on the surface 32a of the first shield 32 where the film is deposited relatively thickly. Since the second shield 33 is not opposite the target 31, sputtered particles are deposited thereon only in a negligible amount in one cycle of processing. Desired high film quality can thereby be achieved. Furthermore, it takes time until the film deposited on the second shield 33 becomes thick enough to peel off, and thus the peeling caused by heat shock is delayed. The period in which the shields are usable can thereby be lengthened.

Figure 5:
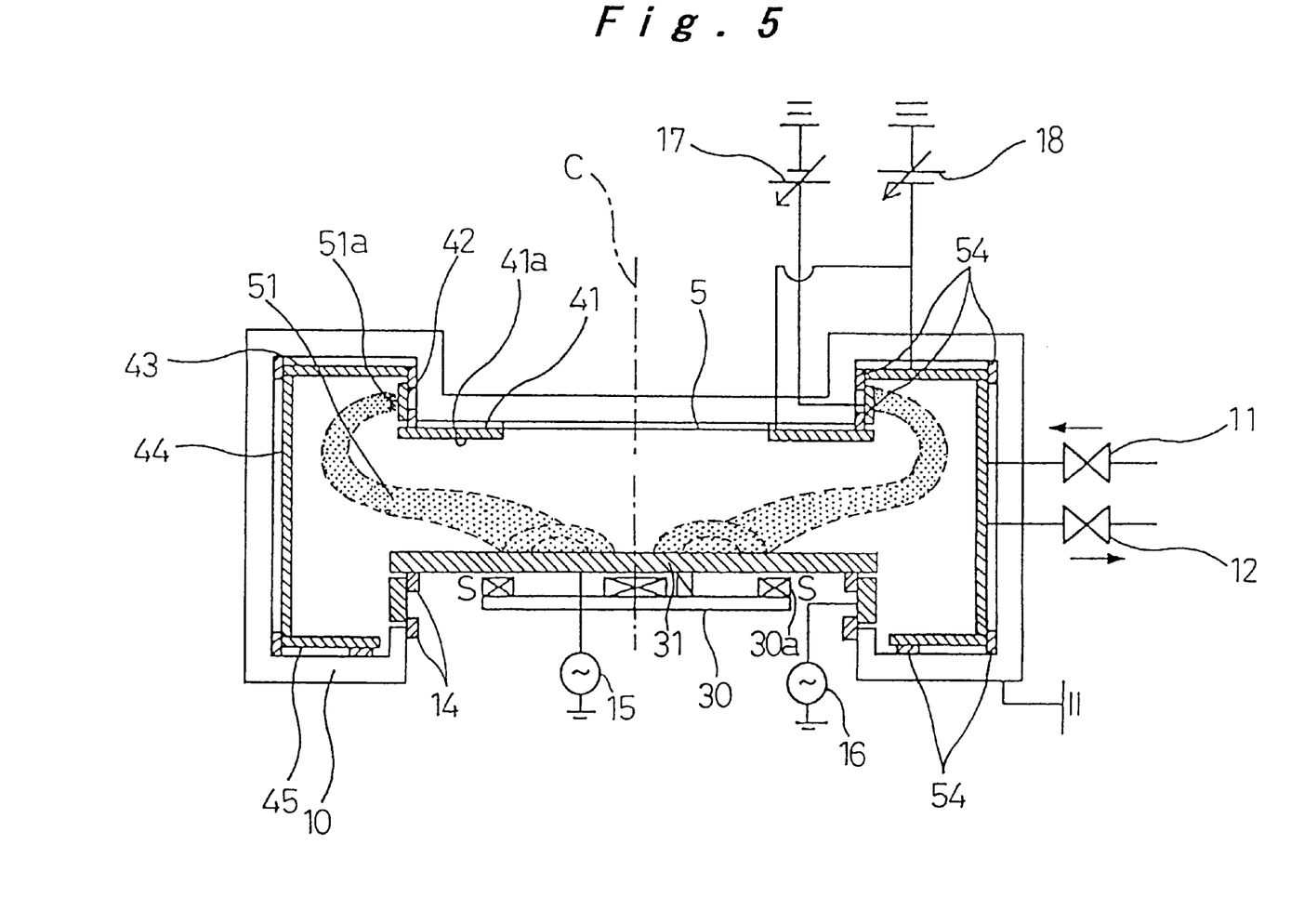
FIG. 5 is a schematic diagram showing a construction of a magnetron sputtering apparatus according to a fifth embodiment of the present invention.

FIG. 5 shows a fifth embodiment of the present invention. The inner wall of the vacuum chamber 10 is covered with replaceable shields 41–45 except for a portion where the substrate exists. Although not shown, heaters or thermocouples are respectively connected to each of the shields 41–45 for heat control thereof. The elements identical to those in the previously described embodiments are given the same reference numerals, and the descriptions thereof are omitted.

The first shield 41 functions as a first shielding portion opposite the target 31 and the second shield 42 functions as a second shielding portion, not opposite the target 31, but at a periphery of the first shielding portion. The shields 41–45 are electrically insulated from the vacuum chamber 10 by insulators 54. Further, the second shield 42 is insulated from the other shields 41 and 43–45, and it is connected to a first power source 17 for controlling potential of the second shield 42. The shields 41 and 43–45 are connected to a separate second power source 18 for controlling potential thereof. The first and second power sources 17, 18 are controlled such that the potential of the second shield 42 is higher than the potential of other shields 41 and 43–45. The apparatus is operated as previously described.

Figure 6:
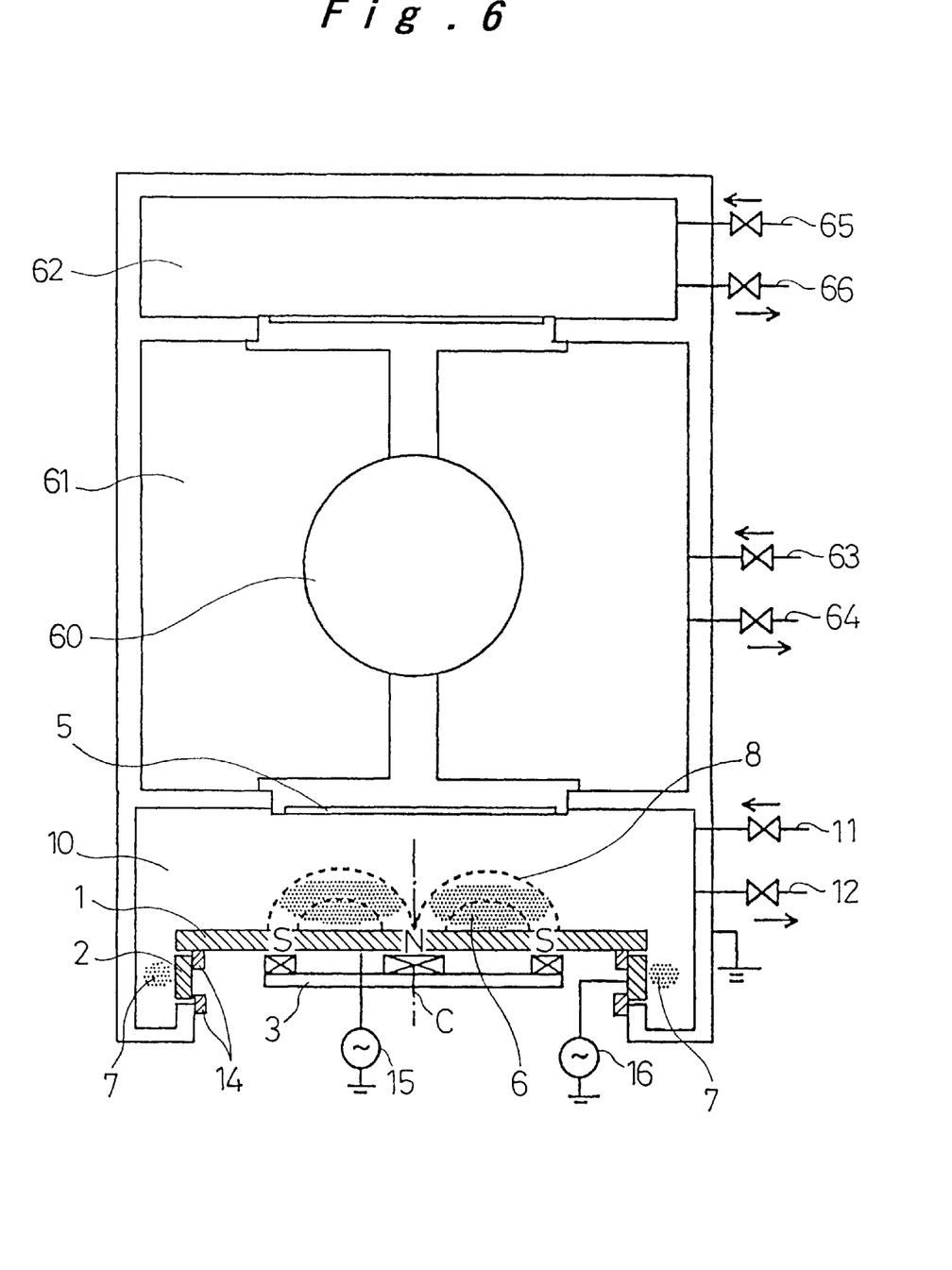
FIG. 6 is a schematic diagram showing a construction of a magnetron sputtering apparatus according to a sixth embodiment of the present invention.
Figure 7:
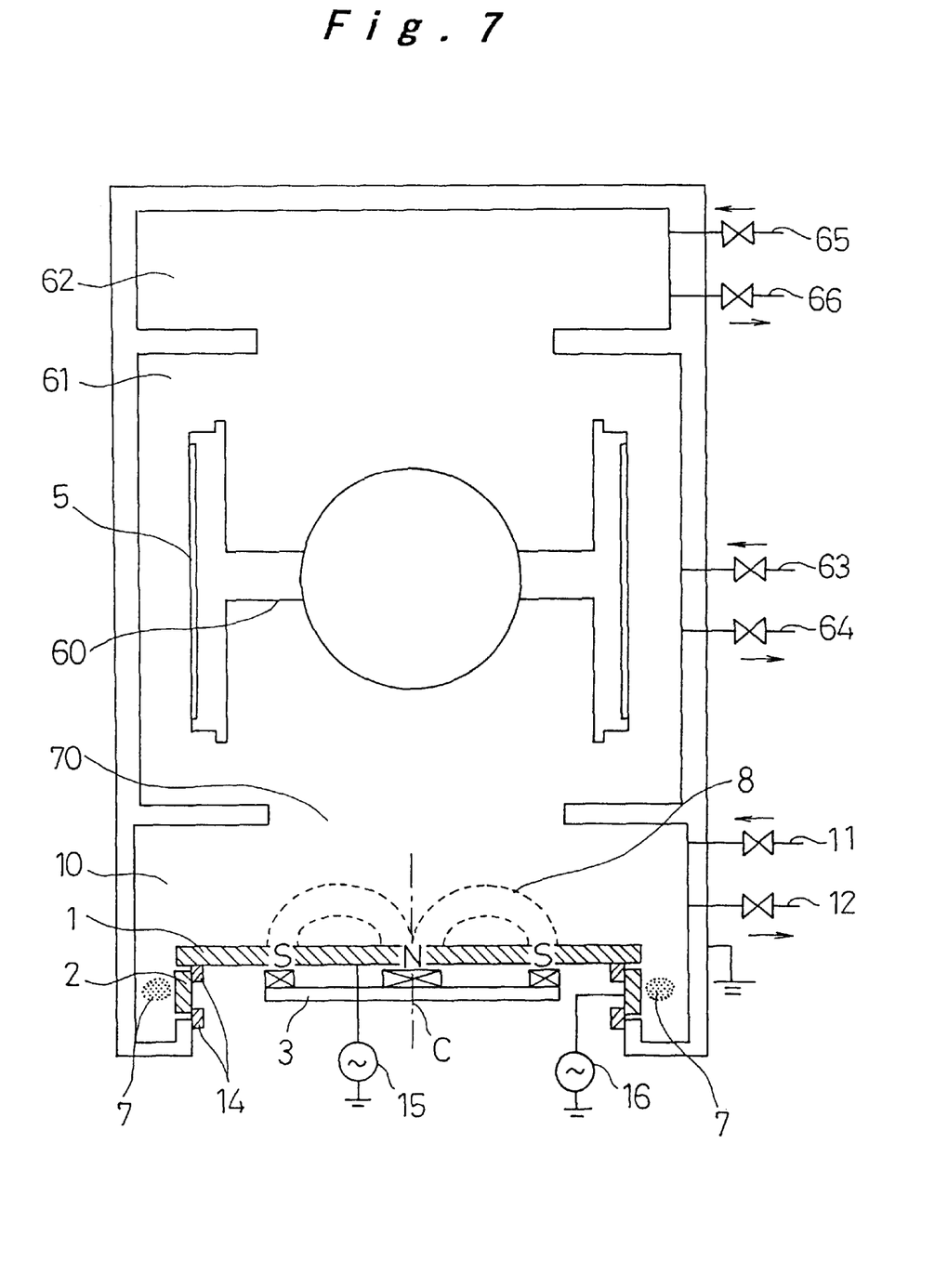
FIG. 7 is a schematic diagram showing a state of the magnetron sputtering apparatus according to the sixth embodiment during transfer of a substrate.

Since the potential of the second shield 42 is set higher than the potential of the shields 41 and 43–45, electrons of the plasma 51 are led towards the shield 42 by the difference of potential. That is, surface 51a, which is subjected to heat shock by the plasma 51, is set on the surface of the second shield 42 and not on surface 41a of the first shield 41, where the film is deposited relatively thickly. Since the second shield 42 is not opposite the target 31, sputtered particles are deposited thereon only in a negligible amount in one cycle of processing. It takes time until the film deposited on the second shield 42 becomes thick enough to peel off, and thus the peeling caused by heat shock is delayed. The period in which the shields are usable can be lengthened. When the electric power of the discharge is large and the plasma density is high, the difference of potential can be obtained simply by grounding the second shield 42 and by placing a potential of other shields 41 and 43–45 into a floating state. The power sources 17, 18 can be thereby omitted, and the construction of the apparatus can be simplified. It should be noted that the construction of the two separate targets identical to the one shown in FIG. 1 is shown in FIG. 4 and FIG. 5 as one example, but such shield construction as described above with reference to FIGS. 4 and 5 can of course be applied to either of the structures shown in FIGS. 2 and 3. Although not shown in FIGS. 1 to 5 for the ease of explanation, the vacuum chamber 10 is normally connected to a transfer chamber for loading and unloading substrates into and from the vacuum chamber. The present invention method is advantageous not only in that it enables a high quality film to be formed, but also in that it prevents sputtered particles from flowing into the transfer chamber next to the vacuum chamber during transfer of substrates. Next, one such example of the magnetron sputtering apparatus according to the present invention is described with reference to FIG. 6 and FIG. 7. In FIG. 6 and FIG. 7, reference numerals 10, 61, and 62 respectively represent the vacuum chamber, a transfer chamber, and a load-lock chamber or a processing chamber in which processing other than that performed in the vacuum chamber 10 is performed to a substrate 5. Other elements identical to those in the previously described embodiments are given the same reference numerals, and the descriptions thereof are omitted. For the purpose of simplifying explanation, an example of three-chamber construction is shown in the drawing, but in general a plurality of processing chambers 62 are provided around the transfer chamber 61. Each of the chambers is capable of maintaining a vacuum condition therein, and is provided with respective gas supply lines 11, 63, 65 and evacuation lines 12, 64, 66. Although not shown, the apparatus is connected to a control unit for effecting control of overall operation of the apparatus.

The transfer chamber 61 is equipped with a transfer mechanism 60 which conveys a substrate 5 between the vacuum chamber 10 and the processing chamber 62. Target 1 is disposed opposite the substrate 5 in the vacuum chamber 10, and a second target 2 is arranged such as not to oppose the substrate 5. A DC or AC high power source 15 is connected to the first target 1, and another high-voltage power source 16 is connected to the second target 2 independently of the first target 1. A magnetic circuit 3 is disposed on the backside of the first target 1 for generating a line of magnetic force 8 above the first target 1. Insulating material 14 is interposed both between the vacuum chamber 10 and the second target 2 and between the first target 1 and the second target 2.

The apparatus is operated as described below. As shown in FIG. 7, a new substrate 5, on which film-deposition is to be performed, is conveyed by the transfer mechanism 60 through the transfer chamber 61 and loaded into the vacuum chamber 10. During transfer of the substrate, an inert gas such as Ar or the like is introduced from the gas supply lines 11, 63, 65, while evacuating the gas through the evacuation lines 12, 64, 66 so as to maintain the pressure in the vacuum chamber 10 and the transfer chamber 61 at a predetermined pressure. Meanwhile, no power is supplied from the high-voltage power source 15, while power is supplied from the high-voltage power source 16 at a minimum necessary level for maintaining electric discharge 7 above the second target 2. After the transfer of substrate has been completed and the substrate 5 is positioned at a predetermined position relative to the opposite target 1, the vacuum chamber 10 is shut out from the transfer chamber 61 as shown in FIG. 6. The discharge area is thereby restricted in a confined space in which electric power is supplied in an optimal amount for film deposition, and as a result, electric discharge is made stable.

In this state, film-deposition is performed on the substrate as previously described with reference to FIG. 1.

At the time point when a desired film deposition has been accomplished, the power supply from the high-voltage power source 15 is stopped, while continuing power supply from the high-voltage power source 16. The film-deposited substrate 5 is conveyed to the processing chamber 62 through the transfer chamber 61 for a next processing operation. According to this embodiment of the present invention, discharge state is maintained without interruption of the electric discharge 7 above the second target 2. The loss in speed of film-deposition at the time of discharge firing is eliminated, and productivity is thereby enhanced. Furthermore, maintained discharge is achieved at the second target 2 which is positioned not opposite to the substrate entrance 70, and sputter particles rarely enter the transfer chamber 61 through the substrate entrance 70. Therefore, the transfer chamber 61 can be made essentially maintenance-free, and operation rate can be thereby increased.

Although the present invention has been fully described in connection with the preferred embodiment thereof, it is to be noted that various changes and modifications apparent to those skilled in the art are to be understood as included within the scope of the present invention as defined by the appended claims unless they depart therefrom.

What is claimed is:

1. A magnetron sputtering method comprising:

arranging a first target within a vacuum chamber;

arranging a substrate opposite the first target within the vacuum chamber;

arranging a second target within the vacuum chamber with a target surface not facing the substrate;

introducing a gas into the vacuum chamber and adjusting pressure within the vacuum chamber to a first predetermined pressure;

providing first and second electromagnets respectively to the first target and the second target;

reducing the pressure within the vacuum chamber to a second predetermined pressure lower than the first predetermined pressure;

supplying current to the second electromagnet and not to the first electromagnet during a period when the vacuum chamber is at the first predetermined pressure and is being reduced to the second predetermined pressure; and supplying electric current to the first electromagnet after the second pressure is reached so that film-formation on the substrate is effectuated.

2. The method of claim 1 wherein said target surface of said second target has a normal axis substantially perpendicular to a normal axis of a target surface of said first target.

3. A magnetron sputtering method comprising:

arranging a first target within a vacuum chamber;

arranging a substrate opposite the first target within the vacuum chamber;

arranging a second target within the vacuum chamber with a target surface not facing the substrate;

introducing a gas into the vacuum chamber and adjusting pressure within the vacuum chamber to a first predetermined pressure;

providing a first magnet and a second magnet respectively to the first target and the second target for creating magnetic fields above the first target and the second target;

movably supporting the first magnet so as to be movable to and from the first target to permit application and removal of the magnetic field above the first target;

reducing the pressure in the vacuum chamber from the first predetermined pressure to a second predetermined pressure which is less than the first predetermined pressure;

positioning the first magnet away from the first target so that a magnetic field is formed only above the second target by use of the second magnet while the vacuum chamber is at the first predetermined pressure and while the pressure in the vacuum chamber is being reduced to the second predetermined pressure;

applying a voltage to the second target to generate plasma at the second target when the pressure is at the first predetermined pressure; and positioning the first magnet near the first target, when the second predetermined pressure is reached, so that a magnetic field is formed above the first target by at least the first magnet and applying a voltage across the first target and the substrate so that film-formation on the substrate is effectuated.

4. The method of claim 3 wherein said target surface of said second target has a normal axis substantially perpendicular to a normal axis of a target surface of said first target.

5. A magnetron sputtering apparatus for forming a film on a substrate, comprising:

a vacuum chamber equipped with a gas supply line and a gas discharge line for introducing gas into the vacuum chamber and for adjusting pressure within the vacuum chamber;

a first target arranged opposite the substrate within the vacuum chamber;

a second target arranged not opposite the substrate within the vacuum chamber, the second target being formed in an annular shape and arranged at a perimeter of the first target such that a target surface of the second target faces in a direction not directed toward a targeted surface of the substrate;

a first power source for applying voltage across the substrate and the first target;

a second power source for applying voltage across the substrate and the second target; and a control unit for adjusting pressure within the vacuum chamber and for applying voltage to the first target and the second target independently of each other such that:

the vacuum chamber is adjusted to a first predetermined pressure, a plasma is generated above the second target when the chamber is at the first predetermined pressure, and the first target is maintained in a condition not effecting sputtering while the vacuum chamber is at the first predetermined pressure;

the pressure is reduced in the vacuum chamber to a second predetermined pressure while plasma is generated above the second target and the first target is maintained in a condition not effecting sputtering;

the first target is placed in a condition effecting sputtering to deposit a film on the substrate when the vacuum chamber is at the second predetermined pressure; and during a transfer of the substrate, electric discharge is maintained above the second target.

6. The apparatus of claim 5 wherein said target surface of said second target has a normal axis substantially perpendicular to a normal axis of a target surface of said first target.

7. A magnetron sputtering apparatus for forming a film on a substrate, comprising:

a vacuum chamber equipped with a gas supply line and a gas discharge line for introducing gas into the vacuum chamber and for adjusting pressure within the vacuum chamber;

a target comprising a front surface which faces opposite the substrate and an annular surface formed at perimeter of the front surface such as to project toward a direction not directed toward the substrate so as not to face opposite the substrate;

a power source for applying voltage across the substrate and the target;

a first electromagnet arranged on a side of the target opposite from the front surface of the target for forming a magnetic field above the front surface of the target;

a second electromagnet arranged on an inside of the annular surface of the target for forming a magnetic field above the annular surface of the target; and a control unit for adjusting pressure within the vacuum chamber and for supplying electric current to the first electromagnet and the second electromagnet independently of each other such that:

the vacuum chamber is adjusted to a first predetermined pressure, a plasma is generated above the annular surface when the chamber is at the first predetermined pressure, and the front surface of the target is maintained in a condition not effecting sputtering while the vacuum chamber is at the first predetermined pressure;

the pressure is reduced in the vacuum chamber to a second predetermined pressure while plasma is generated above the annular surface and the front surface is maintained in a condition not effecting sputtering; and the front surface is placed in a condition effecting sputtering and film formation on the substrate when the vacuum chamber is at the second predetermined pressure.

8. A magnetron sputtering apparatus for forming a film on a substrate, comprising:

a vacuum chamber equipped with a gas supply line and a gas discharge line for introducing gas into the vacuum chamber and for adjusting pressure within the vacuum chamber;

a target comprising a front surface which faces opposite the substrate and an annular surface formed at perimeter of the front surface such as to project toward a direction not directed toward the substrate so as not to face opposite the substrate;

a power source for applying voltage across the substrate and the target;

a first magnet arranged on a side of the target opposite from the front surface of the target for forming a magnetic field above the front surface of the target, the first magnet being supported such as to be movable to and from the target;

a second magnet arranged on an inside of the annular surface of the target for forming a magnetic field above the annular surface of the target; and a control unit for adjusting pressure within the vacuum chamber, and for positioning the first magnet at a position near the target and at a position away from the target such that:

the vacuum chamber is adjusted to a first predetermined pressure, a plasma is generated above the annular surface when the chamber is at the first predetermined pressure, and the front surface of the target is maintained in a condition not effecting sputtering while the vacuum chamber is at the first predetermined pressure due to the first magnet being positioned away from the target;

the pressure is reduced in the vacuum chamber to a second predetermined pressure while plasma is generated above the annular surface and the front surface is maintained in a condition not effecting sputtering due to the first magnet being positioned away from the target; and the front surface is placed in a condition effecting sputtering and film formation on the substrate when the vacuum chamber is at the second predetermined pressure due to the first magnet being positioned near the target.

9. A magnetron sputtering apparatus for forming a film on a substrate, comprising:

a vacuum chamber equipped with a gas supply line and a gas discharge line for introducing gas into the vacuum chamber and for adjusting pressure within the vacuum chamber;

a target disposed in the vacuum chamber;

a support supporting the substrate opposite the target within the vacuum chamber;

a first shield opposite the target for covering a periphery of the substrate;

a second shield having a planar surface not facing the target, exposed for accepting electrons, and arranged at a perimeter of the first shield;

a magnetic field control member provided on a backside of the second shield for attracting electrons to said planar surface during sputtering of the target effected to produce film on the substrate;

a magnetic circuit provided on a backside of the target; and the magnetic field control member including a magnet having a polarity near the second shield the same as a polarity on an outer side of said magnetic circuit adjacent a periphery of the target so as to draw said electrons to said planar surface of said second shield.

10. A magnetron sputtering apparatus for forming a film on a substrate, comprising:

a vacuum chamber equipped with a gas supply line and a gas discharge line for introducing gas into the vacuum chamber and for adjusting pressure within the vacuum chamber;

a target disposed in the vacuum chamber;

a support supporting the substrate opposite the target within the vacuum chamber;

a first shield opposite the target for covering a periphery of the substrate;

a second shield having a planar surface not facing the target and being arranged at a perimeter of the first shield;

a first voltage source applying a potential to the first shield to deter electrons from impinging on the first shield; and a second voltage source applying a potential to the second shield to attract electrons onto the second shield.

11. A magnetron sputtering method comprising:

loading a substrate into a vacuum chamber through a transfer chamber at a vacuum condition and effecting film formation on the substrate in the vacuum chamber;

isolating the vacuum chamber from the transfer chamber during the film formation on the substrate;

the film formation being effected by the following steps:
    providing a first target opposite the substrate and within the vacuum chamber;
    providing a second target not opposite the substrate within the vacuum chamber; and
    applying voltage individually to respective ones of the first target and the second target said applying voltage including:
        applying voltage only to the second target during transfer of the substrate into the vacuum chamber; and
        applying voltage to the first target at a time point when the substrate and the target are positioned at predetermined positions relative to each other until film-formation on the substrate to a desired thickness is completed.

12. A magnetron sputtering apparatus for forming a film on a substrate, comprising:

a vacuum chamber equipped with a gas supply line and a gas discharge line for introducing gas into the vacuum chamber and for adjusting pressure within the vacuum chamber;

a first target arranged opposite the substrate within the vacuum chamber;

a second target arranged not opposite the substrate within the vacuum chamber;

a first power source for applying voltage across the substrate and the first target;

a second power source for applying voltage across the substrate and the second target; and a control unit for adjusting pressure within the vacuum chamber and for applying voltage to the first target and the second target independently of each other such that:

the vacuum chamber is adjusted to a first predetermined pressure, a plasma is generated above the second target when the chamber is at the first predetermined pressure, and the first target is maintained in a condition not effecting sputtering while the vacuum chamber is at the first predetermined pressure;

the pressure is reduced in the vacuum chamber to a second predetermined pressure while plasma is generated above the second target and the first target is maintained in a condition not effecting sputtering;

the first target is placed in a condition effecting sputtering to deposit a film on the substrate when the vacuum chamber is at the second predetermined pressure; and during a transfer of the substrate, electric discharge is maintained above the second target.

13. The apparatus of claim 12 wherein a target surface of said second target has a normal axis substantially perpendicular to a normal axis of a target surface of said first target.

* * * * *